US010163932B1

(12) United States Patent
Sinitskii et al.

(10) Patent No.: US 10,163,932 B1
(45) Date of Patent: Dec. 25, 2018

(54) MEMORY DEVICE BASED ON HETEROSTRUCTURES OF FERROELECTRIC AND TWO-DIMENSIONAL MATERIALS

(71) Applicant: NUtech Ventures, Lincoln, NE (US)

(72) Inventors: Alexander Sinitskii, Lincoln, NE (US); Alexei Grouverman, Lincoln, NE (US); Alexey Lipatov, Lincoln, NE (US)

(73) Assignee: NUtech Ventures, Lincoln, NE (US)

( * ) Notice: Subject to any disclaimer, the term of this patent is extended or adjusted under 35 U.S.C. 154(b) by 0 days.

(21) Appl. No.: 15/218,795

(22) Filed: Jul. 25, 2016

Related U.S. Application Data

(60) Provisional application No. 62/196,523, filed on Jul. 24, 2015.

(51) Int. Cl.
*H01L 27/115* (2017.01)
*H01L 27/1159* (2017.01)

(52) U.S. Cl.
CPC .............................. *H01L 27/1159* (2013.01)

(58) Field of Classification Search
CPC ............... H01L 27/1159; H01L 29/516; H01L 27/11585
USPC ........................................................ 257/295
See application file for complete search history.

(56) References Cited

U.S. PATENT DOCUMENTS

| | | | |
|---|---|---|---|
| 7,148,106 B2 | 12/2006 | Joo et al. | |
| 7,501,680 B2 | 3/2009 | Seol et al. | |
| 7,759,723 B2 | 7/2010 | Lee et al. | |
| 8,710,628 B2 | 4/2014 | Krieger | |
| 8,916,914 B2 | 12/2014 | Kim et al. | |
| 2005/0162895 A1 | 7/2005 | Kuhr et al. | |
| 2010/0261338 A1* | 10/2010 | Tsakalakos | B82Y 10/00 438/478 |
| 2014/0131698 A1* | 5/2014 | Kim | H01L 29/78681 257/42 |

(Continued)

OTHER PUBLICATIONS

Chanthbouala et al, "Solid-state memories based on ferroelectric tunnel junctions", 2011, Nature Nanotechnology Letters, vol. 7, p. 101-104.*

(Continued)

*Primary Examiner* — Mohsen Ahmadi
*Assistant Examiner* — Patricia Reddington
(74) *Attorney, Agent, or Firm* — Harness, Dickey & Pierce, P.L.C.

(57) ABSTRACT

A ferroelectric random-access memory structure and processes for fabricating a ferroelectric random-access memory structure are described that includes using a molybdenum sulfide layer. In an implementation, a ferroelectric random-access memory structure in accordance with an exemplary embodiment includes at least one FeFET, which further includes a substrate; a back gate electrode formed on the substrate, the back gate electrode including a conductive layer; a gate dielectric substrate formed on the back gate electrode; a source electrode formed on the gate dielectric substrate; a drain electrode formed on the gate dielectric substrate; and a layered transition metal dichalcogenide disposed on the gate dielectric substrate and contacting the source electrode and the drain electrode.

13 Claims, 10 Drawing Sheets

(56) References Cited

U.S. PATENT DOCUMENTS

| | | | |
|---|---|---|---|
| 2014/0191335 A1* | 7/2014 | Yin | H01L 27/0886 257/401 |
| 2014/0197459 A1* | 7/2014 | Kis | H01L 29/66742 257/194 |

OTHER PUBLICATIONS

Garcia et al, "Artificial multiferroic heterostructures for an electrical control of magnetic properties", 2015, C.R. Physique, vol. 16, 168-181.*

Bruna da Silva, "Effect of drawing on the dielectric properties and polarization of pressed solution cast b-PVDF films", 2010, J Mater Sci, vol. 45, 4206-4215.*

Lee et al, "Flexible graphene-PZT ferroelectric nonvolatile memory",2013, Nanotechnology, vol. 24,pp. 1 -6.*

Radisavljevic et al, "Single-layer MoS2 Transistors", 2011, Nature Nanotechnology Letters, vol. 6, pp. 147-150.*

B. Radisavljevic, et al.: "Single-layer MoS2 Transistors"; Nature Nanotechnology, Jan. 30, 2011.

Sunkook Kim et al.: "High-mobility and low-power thin-film transistors based on multilayer MoS2 crystals" Nature Communications, Aug. 21, 2012.

Wenjing Jie et al.: "Graphene-based hybrid structures combined with functional materials for ferroelectrics and semiconductors"; Nanoscale, 2014, 6, 6346.

Kallol Roy et al.: "Graphene-MoS2 hybrid structures for multifunctional photoresponsive memory devices"; Nature Technology, Oct. 20, 2013.

A.K. Geim et al.: "Van der Waals heterostroctures"; Perspective, Nature, Jul. 25, 2013.

Yi Zheng et al.: "Gate-Controlled non-volatile graphene-ferroelectric memory"; Apr. 23, 2009.

Hyeon Jun Hwang et al.: "Ferroelecric polymer-gated graphene memory with high speed conductivity modulation"; Nanotechnology, 2013.

A. Agronin et al.: "Dynamis of ferroelectric domain growth in the field of atomic force microscope"; University of Nebraska Lincoln, May 26, 2006.

Manish Chhowalla et al.: "The Chemistry of two-dimensional layered transition metal dichalcogenide nanosheets", Nature Chemistry, Mar. 20, 2013.

Yong-Joo Doh and Gyu-Chul Yi: "Nonvolatile memory devices based on few-layer graphene films", Nanotechnology, 2010.

A. Gruverman and A. Kholkin: "Nanoscale ferroelectrics: processing, characterization and future trends", Institute of Physics Publishing, 2006.

H. Lu et al.: "Enhancement of Ferroelectric Polarization Stability by Interface Engineering", Advanced Materials, 2012, vol. 24, pp. 1209-1216.

X. Hong et al.: "High-Mobility Few-Layer Graphene Field Effect Transistors Fabricated on Epitaxial Ferroelectric Gate Oxides", The American Physical Society, Apr. 3, 2009.

H. Hoppe, et al.: "Kelvin Probe Force Microscopy Study on Conjugated Polymer/Fullerene Bulk Heterojunction Organic Solar Cells", American Chemical Society, 2005, pp. 269-274.

S. Jandhyala et al.: "Graphene-ferroelectric hybrid devices for multi-valued memory system", Applied Physics Letters, 2013.

Wenjing Jie et al.: "Ferroelectric Polarization Effects on the Transport Properties of Graphene/PMN-PT Field Effect Transistors", The Journal of Physical Chemistry, 2013.

I. Jung and J.Y. Son: "A nonvolatile memory device made of graphene nanoribbon and a multiferroic BiFeO3 gate dielectric layer", Carbon 50, 2012.

Toshiaki Kato and Rikizo Hatakeyama: "Site-and alignment-controlled growth of graphene nanoribbons from nickel nanobars", Nature Nanotechnology, Sep. 9, 2012.

D. J. Kim et al.: "Retention of resistance states in ferroelectric tunnel memristors", Applied Physics Letters, 2011.

D.J. Kim et al.: "Ferroelectric Tunnel Memristor", American Chemical Society, 2012.

Amit Kumar et al.: "Probing Surface and Bulk Electrochemical Processes on the LaAlO3-SrTiO3 Interface", ACS Nano, 2012.

Wonho Lee et al.: "Flexible graphene-PZT ferroelectric nonvolatile memory", IOP Publishing LTD, 2013.

Alexey Lipatov et al.: "Optoelectrical Molybdenum Disulfide (MoS2)-Ferroelectric Memories", ACS Nano, 2015.

H. Lu et al.: "Ferroelectric tunnel junctions with graphene electrodes", Nature Communications, Nov. 24, 2014.

Wilhelm Melitz et al.: "Kelvin probe force microscopy and its application", Surface Science Reports, 2011.

Guang Xin Ni et al.: "Graphene-Ferroelectric Hybrid Structure for Flexible Transparent Electrodes", ACS Nano, 2012.

Santosh Raghavan et al.: "Long-term retention in organic ferroelectric-graphene memories", Applied Physics Letters, 2012.

A. Rajapitamahuni et al.: "Examining Graphene Field Effect Sensors for Ferroelectric Thin Film Studies", American Chemical Society, 2013.

Emil Song et al.: "Robust bi-stable memory operation in single-layer graphene ferroelectric memory", Applied Physics Letters, 2011.

Biao Wang and C.H. Woo: "Atomic force microscopy-induced electric field in ferroelectric thin films", Journal of Applied Physics, 2003.

Zheng Wen et al.: "Ferroelectric-field-effect-enhanced electroresistance in metal/ferroelectric/semiconductor tunnel functions", Nature Materials, 2013.

* cited by examiner

MEMORY DEVICE BASED ON HETEROSTRUCTURES OF FERROELECTRIC AND TWO-DIMENSIONAL MATERIALS

CROSS-REFERENCE TO RELATED APPLICATIONS

The present application claims the benefit under 35 U.S.C. § 119(e) of U.S. Provisional Application Ser. No. 62/196,523, filed Jul. 24, 2015, and titled "MEMORY DEVICE BASED ON HETEROSTRUCTURES OF FERROELECTRIC AND TWO-DIMENSIONAL MATERIALS." U.S. Provisional Application Ser. No. 62/196,523 is herein incorporated by reference in its entirety.

FEDERALLY SPONSORED RESEARCH OR DEVELOPMENT

This invention was made with Government support under grant DMR-1420645 awarded by the National Science Foundation (NSF) through the Nebraska Materials Research Science and Engineering Center (MRSEC). The Government has certain rights in this invention.

BACKGROUND

Ferroelectric random-access memory (FeRAM) is a nonvolatile memory technology, which uses polarization of a ferroelectric material to store data. FeRAM devices are produced commercially for applications including smart cards, radio frequency identification tags, power meters, printers, industrial microcontrollers and video games. FeRAMs have a number of advantages over more commonly used flash memories, including significantly lower power usage, significantly larger number of write-erase cycles and faster performance.

SUMMARY

A ferroelectric random-access memory structure and processes for fabricating a ferroelectric random-access memory structure are described that includes using a molybdenum sulfide layer. In an implementation, a ferroelectric random-access memory structure in accordance with an exemplary embodiment includes at least one ferroelectric field effect transistor (FeFET), which further includes a substrate; a back gate electrode formed on the substrate, the back gate electrode including a conductive layer; a gate dielectric substrate formed on the back gate electrode; a source electrode formed on the gate dielectric substrate; a drain electrode formed on the gate dielectric substrate; and a layered transition metal dichalcogenide disposed on the gate dielectric substrate and contacting the source electrode and the drain electrode.

In another implementation, a ferroelectric random-access memory structure in accordance with an exemplary embodiment can include at least one ferroelectric tunnel junction (FTJ), which can further include a substrate; a bottom electrode formed on the substrate, a ferroelectric barrier with the thickness of less than several nanometers formed on the bottom electrode; and a layered transition metal dichalcogenide disposed on the ferroelectric barrier.

In an implementation, a process for fabricating a ferroelectric random-access memory structure in accordance with an exemplary embodiment includes forming a transparent film including placing molybdenum disulfide (MoS2) flakes on a substrate; coating the substrate with polymethyl methacrylate (PMMA); and removing the substrate; placing the transparent film on a ferroelectric substrate, for example lead zirconium titanate (PZT) thin film, and forming at least one electrode on the lead zirconium titanate (PZT) substrate.

In an implementation, a process for fabricating a ferroelectric random-access memory structure in accordance with an exemplary embodiment includes coating a substrate with molybdenum disulfide (MoS2) flakes; and patterning electrodes on the molybdenum disulfide (MoS2) flakes using electron beam lithography This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Figure 1A:
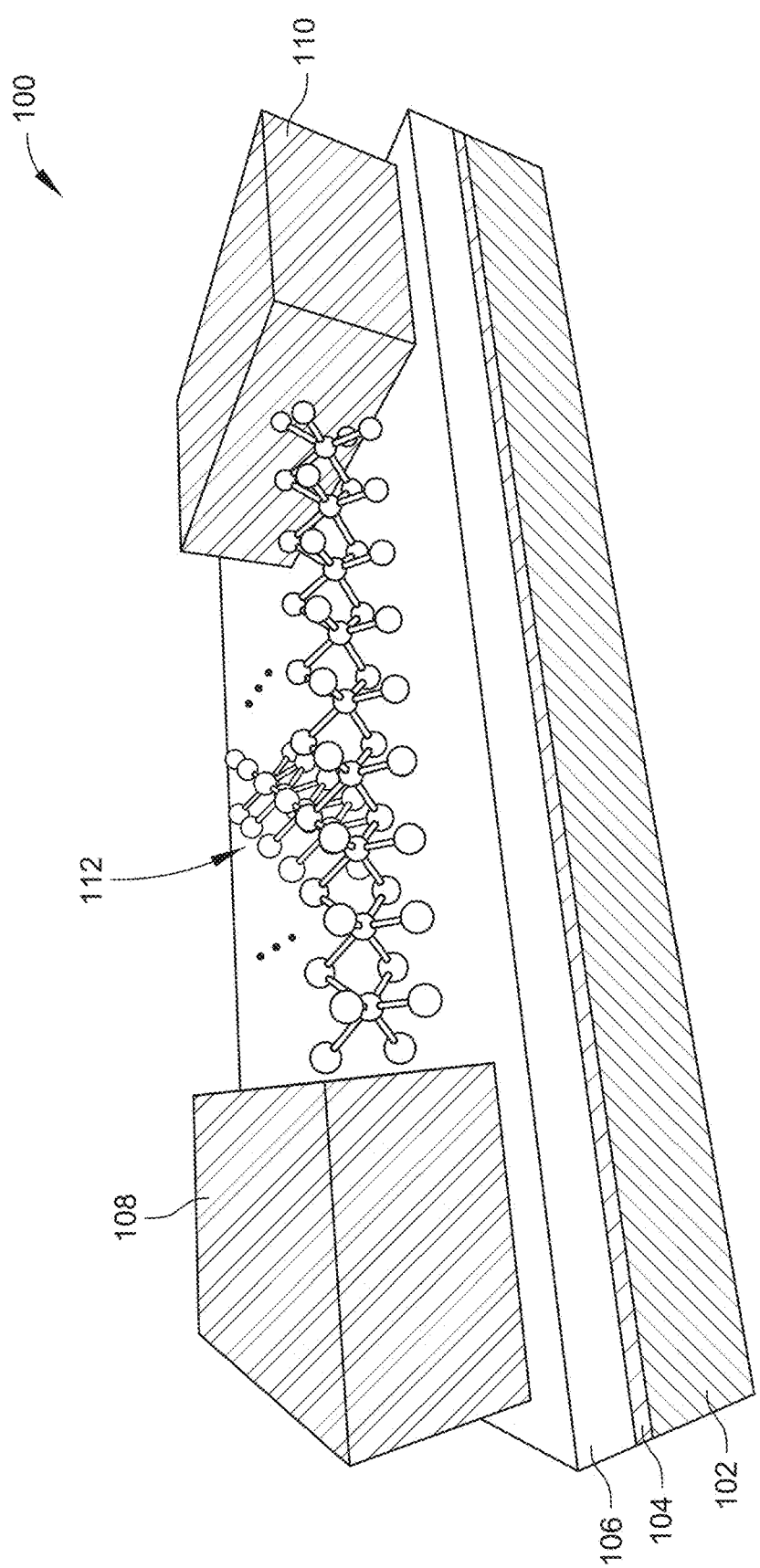
FIG. 1A is an isometric view illustrating an embodiment of a ferroelectric random-access memory structure that includes using a molybdenum sulfide layer, in accordance with an example implementation of the present disclosure.

Ferroelectric random-access memory (FeRAM) is a nonvolatile memory technology, which uses polarization of a ferroelectric material to store data. FeRAM devices are produced commercially for applications including smart cards, radio frequency identification tags, power meters, printers, industrial microcontrollers and video games.

Embodiments using ferroelectrics in FeRAM devices can include (a) ferroelectric capacitors and (b) field effect transistors. In ferroelectric capacitors, a ferroelectric layer with a typical thickness of about 100 nm is sandwiched between the top and bottom electrodes, and the stored information is read out by detecting the transient current flowing in the external circuit between the electrodes upon reversal of polarization. As a result, the read out operation is destructive and the information needs to be restored after reading. A modification of the ferroelectric capacitors, called ferroelectric tunnel junctions (FTJ), can employ ferroelectric layers with the thickness of just several nanometers, which can allow direct tunneling current to flow across the layer. As the current (or resistance) strongly depends on the polarization direction, information can be read out simply by measuring its magnitude without switching the polarization. Hence, the read out operation in FTJ is non-destructive, which makes it faster and more energy efficient.

The structure of a FeFET can be similar to that of a metal-oxide-semiconductor field-effect transistor, where a dielectric layer can be replaced by a ferroelectric film. Application of the gate bias can be applied to the top or bottom electrode, where the carriers accumulate or deplete at the ferroelectric (FE)-semiconductor interface, thereby modulating its resistance (in-plane conductivity). The information read out can be performed by measuring the in-plane current and is non-destructive.

FeRAMs have a number of advantages over more commonly used flash memories, including significantly lower power usage, significantly larger number of write-erase cycles and faster performance. However, FeRAM market accounts for only about $150 million/year compared to about $30 billion/year market of flash memories because the current FeRAM technology faces several serious problems.

With the ongoing miniaturization trend there is constant need for smaller devices and higher data storage densities. However, the ability to scale down FeRAM memory elements and increase the data storage density is limited, because a single FeRAM cell consists of two transistors and two capacitors, a structure commonly referred to as a 2T-2C cell, which is rather bulky. Another reason why scaling down the conventional FeRAM cells is difficult is that the amount of stored charge is decreasing with the cell size. Other scaling-related problems are imprint, initial or induced, which happens when a cell is kept in a certain state for a long time, and the increased leakage.

Long-term stability of FeRAM structures due to the properties of the metal/oxide and ferroelectric/semiconducting interfaces is another serious problem. Ferroelectric materials used for FeRAM applications are complex oxides with perovskite structure, such as $PbZr_xTi_{1-x}O_3$ (PZT), and a precisely controlled stoichiometry. Electrodiffusion of metal atoms in a very thin layer of a perovskite degrades ferroelectric properties and ruins the performance of a FeRAM cell.

Accordingly, a ferroelectric random-access memory structure and processes for fabricating a ferroelectric random-access memory structure are described that includes using a molybdenum sulfide layer. In an implementation, a ferroelectric random-access memory structure in accordance with an exemplary embodiment includes at least one FeFET, which further includes a substrate; a back gate electrode formed on the substrate, the back gate electrode including a conductive layer; a gate dielectric substrate formed on the back gate electrode; a source electrode formed on the gate dielectric substrate; a drain electrode formed on the gate dielectric substrate; and a layered transition metal dichalcogenide disposed on the gate dielectric substrate and contacting the source electrode and the drain electrode.

In an implementation, a process for fabricating a ferroelectric random-access memory structure in accordance with an exemplary embodiment includes forming a transparent film including placing molybdenum disulfide (MoS2) flakes on a substrate; coating the substrate with polymethyl methacrylate (PMMA); and removing the substrate; placing the transparent film on a lead zirconium titanate (PZT) substrate; and forming at least one electrode on the lead zirconium titanate (PZT) substrate.

In an implementation, a process for fabricating a ferroelectric random-access memory structure in accordance with an exemplary embodiment includes coating a substrate with molybdenum disulfide (MoS2) flakes; and patterning electrodes on the molybdenum disulfide (MoS2) flakes using electron beam lithography.

The devices disclosed herein include stable interfaces in FeRAM cells by contacting ferroelectric oxides with small-bandgap semiconductors, such as layered transition metal dichalcogenides (TMDs, e.g. MoS2, $WS_2$, other materials with similar properties may be considered as well). MoS2 and other TMDs are formed by strong covalent bonds between metals and chalcogens. Therefore, for example a MoS2/PZT interface will be intrinsically resistant to electrodiffusion, unlike an Au/PZT interface where weak metallic bonds in Au will not prevent gold from diffusing to PZT. A memory function can be realized with the simple transistor geometry in the FeRAM cells and devices described herein. Moving from a bulky two transistor and two capacitor (2T-2C) cell to a small and simple one transistor (1T) FeRAM cell results in dramatic miniaturization of memory arrays and increases data storage density. Additionally, this technology can be applied to a conventional 2T-2C FeRAM cell or other capacitor-based FeRAM structures.

In another implementation, a ferroelectric random-access memory structure in accordance with an exemplary embodiment can include at least one FTJ, which can further include a substrate; a bottom electrode formed on the substrate, a ferroelectric barrier with the thickness of less than several nanometers formed on the bottom electrode; and a layered transition metal dichalcogenide disposed on the ferroelectric barrier.

The ferroelectric random-access memory structure(s) disclosed herein (e.g., MoS2-PZT devices) have a number of advantages and unique features compared to commercial FeRAMs including low operation voltage, wide memory window, and the ability to be written to and erased both electrically and optically. The unique dual optoelectrical operation of these devices is unique and unprecedented and can dramatically simplify device architecture and offer novel practical functionalities, such as an instant optical erase of large data arrays that is unavailable for many conventional memories.

Example Implementations

Figure 1B:
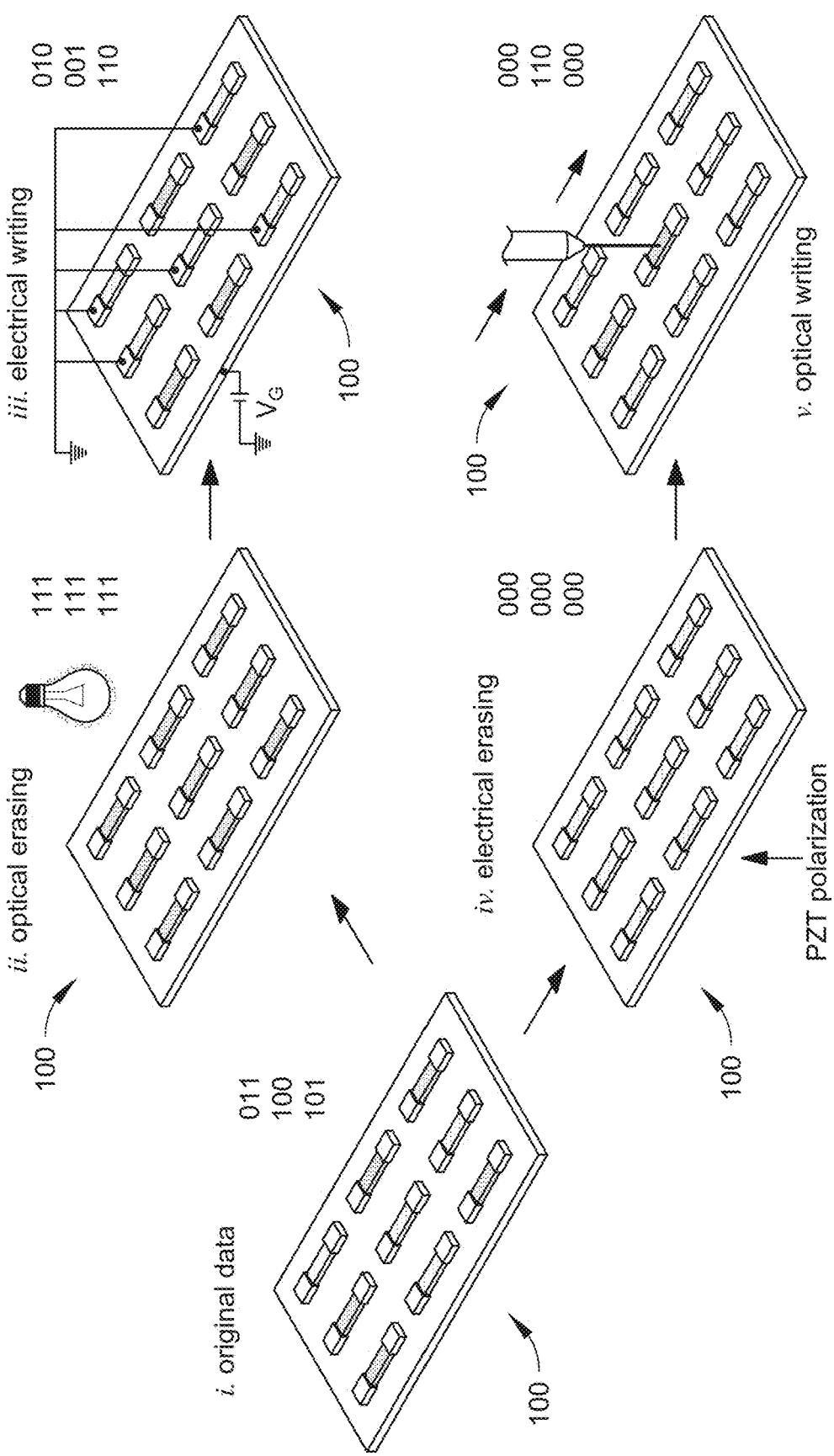
FIG. 1B is a process view illustrating an embodiment of optoelectrical operation of a ferroelectric random-access memory structure that includes using a molybdenum sulfide layer, in accordance with an example implementation of the present disclosure.

FIGS. 1A and 1B illustrate a ferroelectric random-access memory structure 100 in accordance with an example implementation of the present disclosure. The ferroelectric random-access memory structure 100 can include stable interfaces in FeRAM cells by contacting ferroelectric oxides with small-bandgap semiconductors, such as layered transition metal dichalcogenides (TMDs, e.g. $MoS_2$, $WS_2$, etc.). The ferroelectric random-access memory structure 100 may be utilized as memory, for example, for use in a computer. FIG. 1A illustrates one embodiment of a MoS2-based FeFET on a ferroelectric substrate 102 where a Ti/Au source (S) electrode 108 and a Ti/Au drain (D) electrode 110 are bridged by a $MoS_2$ flake (e.g., a layered transition metal dichalcogenide 112). In implementations, the substrate 102 can include silicon and/or silicon dioxide or other materials, and the silicon dioxide layer may be subsequently etched and at least partially removed. In some implementations, the substrate 102 may include a substrate including lead zirconium titanate (e.g., a PZT substrate).

As shown in FIG. 1A, the ferroelectric random-access memory FET structure 100 can include a back gate electrode 104 disposed on the substrate 102. In some implementations, a back gate electrode 104 may include a conductive $TiO_2$/Ir layer. A back gate electrode 104 can include a junction isolated by connecting the substrate to the most positive circuit potential. It is contemplated that other materials may be used for a back gate electrode 104.

The ferroelectric random-access memory FET structure 100 can include a gate dielectric substrate 106. As Shown in FIG. 1A, the gate dielectric substrate 106 can be disposed on the back gate electrode 104 and can function to electrically insulate the back gate electrode 104 from other device regions. In one embodiment, the gate dielectric substrate 106 can include lead zirconium titanate (Pb(Zr,Ti)O$_3$ "PZT"). It is contemplated that the gate dielectric substrate 106 can include other materials.

The ferroelectric random-access memory FET structure 100 can include at least one electrode formed on the gate dielectric substrate 106. For example, the at least one electrode may include a source electrode 108 and/or a drain electrode 110. In a specific implementation, the ferroelectric random-access memory structure 100 can include a Ti/Au source electrode 108 and a Ti/Au drain electrode 110 disposed and/or formed on the gate dielectric substrate 106.

In implementations, the ferroelectric random-access memory FET structure 100 can include a layered transition metal dichalcogenide 112 disposed on the gate dielectric substrate 106 and/or between and contacting a source electrode 108 and a drain electrode 110. In the implementation illustrated in FIG. 1A, the layered transition metal dichalcogenide 112 can include a molybdenum disulfide ($MoS_2$) flake. In a specific implementation using $MoS_2$ flakes, $MoS_2$ flakes on Si/SiO$_2$ substrates were prepared by micromechanical exfoliation from a $MoS_2$ single crystal. In some instances, the MoS2 flakes can include monolayer or multilayer flakes. In one specific instance, the $MoS_2$ flake can include a tri-layer flake.

FIG. 1B illustrates exemplary optoelectrical operation of a ferroelectric random-access memory structure 100 including an array of $MoS_2$-PZT memory devices (in addition to a standard electrical operation that can also be used). FIG. 1B (i) shows an array of $MoS_2$-PZT devices where each $MoS_2$-PZT device is prerecorded in either an ON ("1") or an OFF ("0") state. The entire array can be simultaneously erased optically by setting all devices to an ON state via light illumination, which is shown in FIG. 1B (ii). Such an instant erase of the devices is currently elusive for many conventional memory technologies, and particularly attractive for high capacity data storage systems (in comparison, it takes several hours to erase a modern 1 TB hard disk drive by individually rewriting every memory segment). Once the array of $MoS_2$-PZT devices is optically erased, data can be electrically written by individually accessing the devices that need to be in the OFF state and polarizing the gate dielectric substrate 106 including a PZT substrate under these devices upward, which is shown in FIG. 1B (iii).

In addition to the "optical erase-electrical write" operation of $MoS_2$-PZT memories, it is also possible to implement an "electrical erase-optical write" mode. In this implementation and starting with the same array of prerecorded $MoS_2$-PZT devices illustrated in FIG. 1B (i), the devices can be electrically erased, shown in FIG. 1B (iv), by polarizing the entire gate dielectric substrate 106 including a PZT substrate upward using a global back gate electrode 104 (the PZT switching will occur only under the biased $MoS_2$ flakes, meaning that every device will need to be electrically accessed, which emphasizes the advantage of the optical erasing of $MoS_2$-PZT devices shown in FIG. 1B (ii), where all illuminated devices are erased simultaneously). Then, data can be optically written by individually illuminating the devices that need to be in the ON state using, for example, a focused laser beam, which is illustrated in FIG. 1B (v). This demonstrated optical switching complements the conventional "electrical erase-electrical write" operation mode that can also be realized in these memories.

Figure 1C:
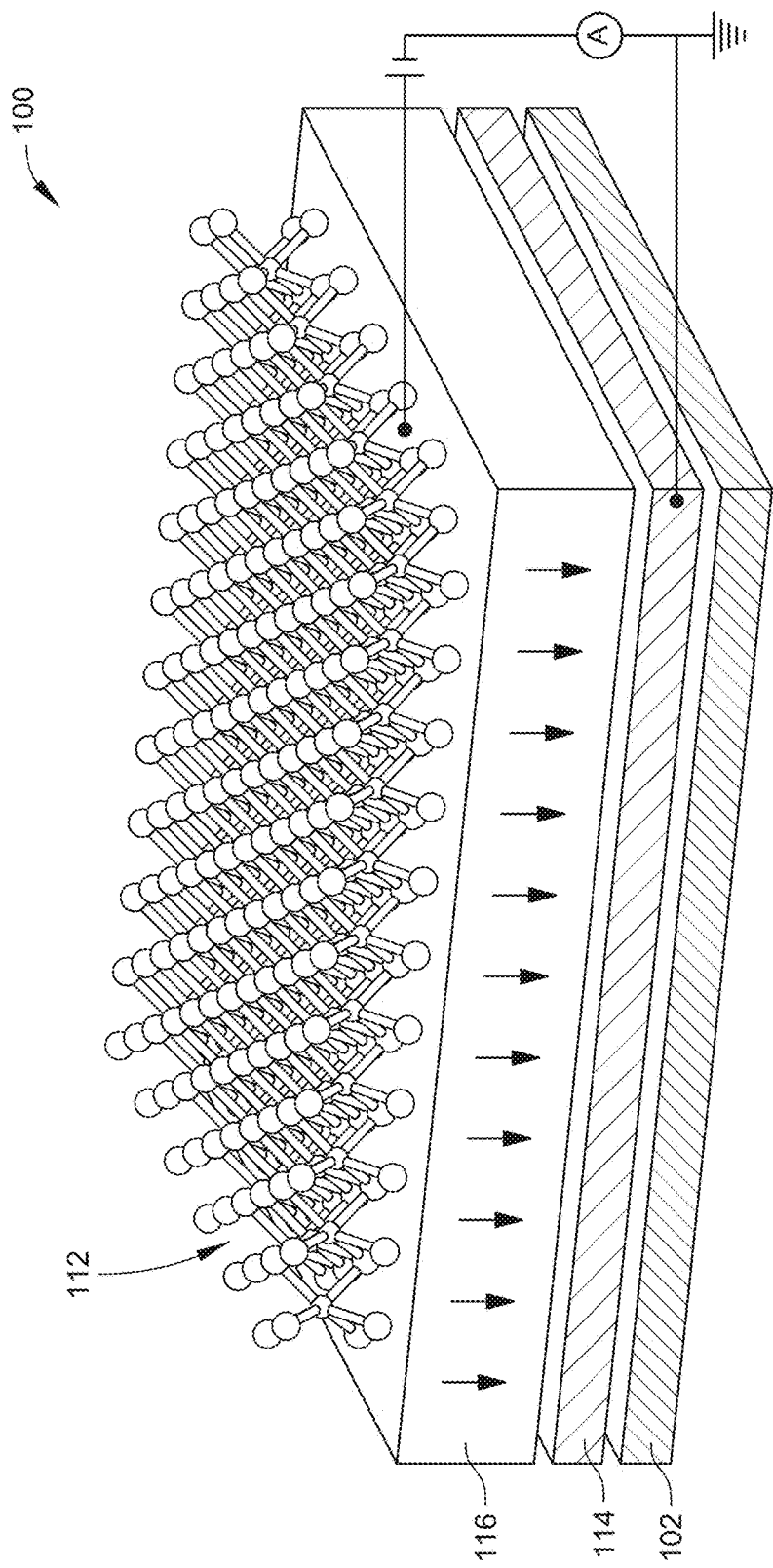
FIG. 1C is an isometric view illustrating an embodiment of a ferroelectric random-access FTJ structure that includes a layered transition metal dichalcogenide, in accordance with an example implementation of the present disclosure.

In another implementation, a ferroelectric random-access memory FTJ structure 100 includes a layered transition metal dichalcogenide 112 disposed on a ferroelectric barrier 116 (e.g., a ferroelectric film) with a thickness of less than 5 nm, which is deposited on a bottom electrode 114. In the implementation illustrated in FIG. 1C, the layered transition metal dichalcogenide 112 can include a molybdenum disulfide ($MoS_2$) flake. In a specific implementation using $MoS_2$ flakes, $MoS_2$ flakes on Si/SiO$_2$ substrates can be prepared by micromechanical exfoliation from a $MoS_2$ single crystal. In some instances, the $MoS_2$ flakes can include monolayer or multilayer flakes. In one specific instance, the $MoS_2$ flake can include a tri-layer flake.

In some implementations, stable spontaneous polarization in ferroelectric films and FET structures 100 can be achieved in ultrathin $BaTiO_3$ (BTO) films over micron length scales via using a few monolayers thick molybdenum disulfide ($MoS_2$) flakes (e.g., layered transitions metal dichalcogenide 112) as a top electrode. The stability of the remnant states remain unaffected by interface characteristics, such as the presence of $NH_3$, and/or $H_2O$ molecules. The transport measurements reveal polarization-induced modulation of potential barrier across the $MoS_2$/BTO interface in agreement with the observed Fermi-level shift of $MoS_2$ on reversal of ferroelectric polarization. Thus, the 2D semiconducting $MoS_2$ layers present an attractive option to be employed as gating materials in electronic and logic devices, such as tunnel junctions based on ultrathin ferroelectric films.

An important advantage of 2D materials is their planar morphology, which allows easy integration with other 2D materials and functional films, resulting in multilayered structures with new properties. In particular, there is a considerable interest in devices in which 2D materials are coupled with ferroelectric (FE) materials. Ferroelectric materials possess an electrically switchable spontaneous electric polarization, which allows a possibility of electrical modulation of the functional properties of the hybrid 2D-FE electronic structures, which are suitable for memory and logic device applications. In one type of these devices, ferroelectric field-effect transistors (FE-FETs), polarization reversal in a ferroelectric layer, used as a gate dielectric (e.g., gate dielectric substrate 106, ferroelectric barrier 116), alters the in-plane conductivity of the adjacent 2D channel. Most of these devices have been fabricated using an archetype 2D material, graphene, in conjunction with an organic or inorganic FE material. In another type of the 2D-FE devices, ferroelectric tunnel junctions (FTJs), graphene was used as a top electrode for the application of polarization switching bias to control perpendicular-to-plane tunneling conductance across the FE layer. This approach provides a simple and straightforward method for interface engineering by encapsulating molecular species at the graphene-FE interface, which dramatically affects the resistive switching effect in FTJs.

However, the functional performance of the FE-FET devices can be significantly improved when graphene, a zero-bandgap semiconductor, which remains highly conductive at any doping level, is replaced with a different 2D material that has a substantial electronic bandgap. Similarly, an enhanced functional behavior exists in FTJs incorporating a 2D semiconducting material as one of the electrodes. This is due to a boost of the tunneling electroresistance (TER) effect in an FTJ with a semiconducting Nb-doped $SrTiO_3$ electrode (e.g., bottom electrode 114) due to polarization-dependent modulation of the charge carrier density at the $BaTiO_3$—$SrTiO_3$ interface. In one embodiment, molybdenum sulfide ($MoS_2$), a transition metal dichalcogenide, can be utilized as a top electrode (e.g., layered transition metal dichalcogenide 112) in $BaTiO_3$ tunnel junctions. Bulk $MoS_2$ is a semiconductor with an indirect bandgap of 1.2 eV, while monolayer $MoS_2$ is a semiconductor with a direct bandgap of 1.8 eV. The conductance of the $MoS2/BaTiO_3$ interface is strongly influenced by polarization direction resulting in a very asymmetric switching behavior: complete switching of polarization from the downward to the upward direction and only partial switching in the opposite direction. This behavior is facilitated by charge injection and transfer of protons, made available by an interfacial water layer, in and out of a semiconducting MoS2 electrode. A direct consequence of the polarization-dependent $MoS_2$ conductance is a giant TER effect of 103 measured in the $MoS_2/BaTiO_3/SrRuO_3$ tunnel junctions. Time-voltage-controlled partial switching of polarization provides an additional degree of freedom to modulate the resistive switching behavior adding memristive functionality to the $MoS_2$-gated BTO junctions.

In a specific implementation, high-quality epitaxial ferroelectric a $BaTiO_3$ (BTO) film (e.g., gate dielectric substrate 106, ferroelectric barrier 116) with a thickness ranging from about 6 to 12 unit cells (u.c.) (i.e., from about 2.4 nm to 4.8 nm, respectively) can be grown via pulsed laser deposition (PLD) on atomically smooth (001) $SrTiO_3$ crystal substrates with a conductive buffer layer. In some embodiments, the gate dielectric substrate 106 and/or the ferroelectric barrier 116 can include multiple layers of different or the same materials (e.g., $BaTiO_3$, $SrRuO_3$, $SrTiO_3$). In-situ monitoring of high-pressure reflection high-energy electron diffraction (RHEED) has previously indicated a layer-by-layer growth with all the layers fully coherent with the single crystal substrate. The grown $BaTiO_3$ films can be compressively strained and may possess only out-of-plane polarization. As-grown $BaTiO_3$ films can be uniformly polarized downward (i.e., with polarization pointing towards the bottom electrode 114). The average thickness of the $MoS_2$ flake in this specific implementation is about 2.1 nm, which corresponds to 3 monolayers of $MoS_2$.

Figures 2A, 2B, 2C, 2D, 2E, 2F:
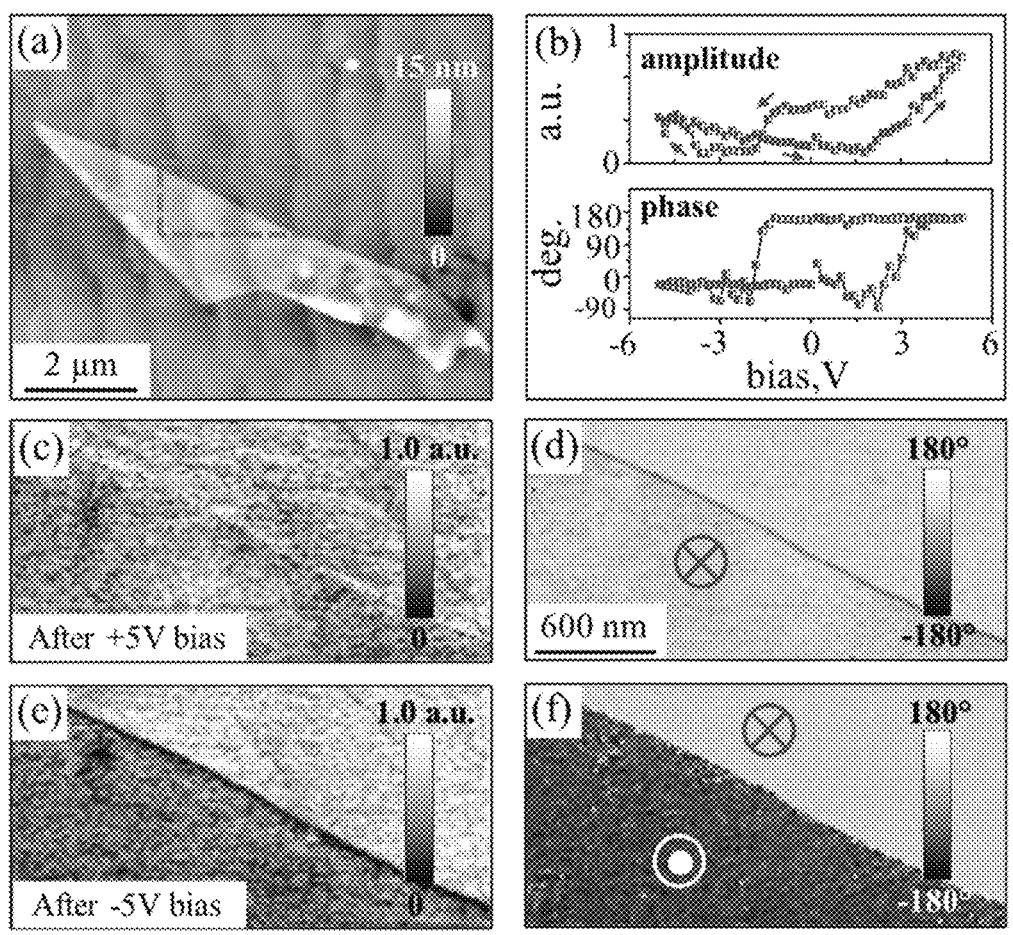
FIG. 2A is a topographical view illustrating a direct-transferred exfoliated $MoS_2$ flake on the surface of a barium titanate (BTO) film used in a FET structure, such as the ferroelectric random-access memory structure shown in FIGS. 1A through 1C, in accordance with an example implementation of the present disclosure.
FIG. 2B is a graphical view illustrating PFM amplitude and phase hysteresis loops, which show switching behavior of a $MoS_2$/barium titanate junction, in accordance with an example implementation of the present disclosure.
FIG. 2C is a topographical view illustrating switching behavior of a $MoS_2$/barium titanate junction used in a FET structure, such as the ferroelectric random-access memory structure shown in FIGS. 1A through 1C, in accordance with an example implementation of the present disclosure.
FIG. 2D is a topographical view illustrating switching behavior of a $MoS_2$/barium titanate junction used in a FET structure, such as the ferroelectric random-access memory structure shown in FIGS. 1A through 1C, in accordance with an example implementation of the present disclosure.
FIG. 2E is a topographical view illustrating switching behavior of a $MoS_2$/barium titanate junction used in a FET structure, such as the ferroelectric random-access memory structure shown in FIGS. 1A through 1C, in accordance with an example implementation of the present disclosure.
FIG. 2F is a topographical view illustrating switching behavior of a $MoS_2$/barium titanate junction used in a FET structure, such as the ferroelectric random-access memory structure shown in FIGS. 1A through 1C, in accordance with an example implementation of the present disclosure.

FIG. 2A shows a topographic image of a typical exfoliated $MoS_2$ flake with an area of about several square microns transferred on the surface of an epitaxial BTO film. The average thickness of the $MoS_2$ flake is about 2.1 nm, which corresponds to 3 monolayers of $MoS_2$. FIG. 2A shows typical hysteresis loops obtained in the $MoS_2$-gated BTO junctions by Piezoresponse Force Microscopy (PFM) spectroscopic testing. A phase loop shows a phase change of about 180° illustrating the switchable nature of the polarization in the $BaTiO_3$ film (e.g., gate dielectric substrate 106, ferroelectric barrier 116) underneath $MoS_2$ (e.g., layered transition metal dichalcogenide 112). Noteworthy, a PFM amplitude loop is strongly asymmetric with respect to the sign of the applied DC bias. FIGS. 2C-2F show PFM images of the polarization states of the $MoS_2$-gated BTO junctions resulting from application of an external bias to the $MoS_2$ flake (to switch polarization in BTO, the $MoS_2$ surface was scanned with an electrically biased PFM tip). Contrast inversion in the PFM phase images (shown in FIGS. 1D and 1F) is an indication of polarization switching in the BTO film underneath the $MoS_2$ flake. This process is also accompanied by appearance or disappearance of a zero amplitude dark line in the PFM amplitude images (See FIGS. 2C and 2E) indicating a 180° domain wall, which coincides with the edge of the $MoS_2$ flake as the BTO film outside of the flake remains unaffected during the switching measurements. It can be seen that the $MoS_2$/BTO/SRO junction with the upward polarization appears with a darker contrast in FIG. 2E than the same junction with the downward polarization (shown in FIG. 2C). Darker contrast in the PFM amplitude image suggests a lower PFM amplitude signal for the upward polarization, which is consistent with the weak PFM amplitude signal for the negative half of the DC bias cycle in the PFM hysteresis loop (see FIG. 2B). This effect may, in principle, be due to a low polarization value for the upward state. Note, however, that the hysteresis loops acquired on a free BTO film surface are quite symmetric. Similarly, BTO films sandwiched between oxide electrodes are also characterized by rather symmetric PFM loops. Given a semiconducting nature of the $MoS_2$ electrode, the low PFM amplitude signal is attributed to the interplay between the screening (majority) charges in the $MoS_2$ and polarization charges of BTO films and the resulting change in the electrical conductivity of the $MoS_2$/BTO interface.

Figures 3A, 3B, 3C, 3D, 3E, 3F:
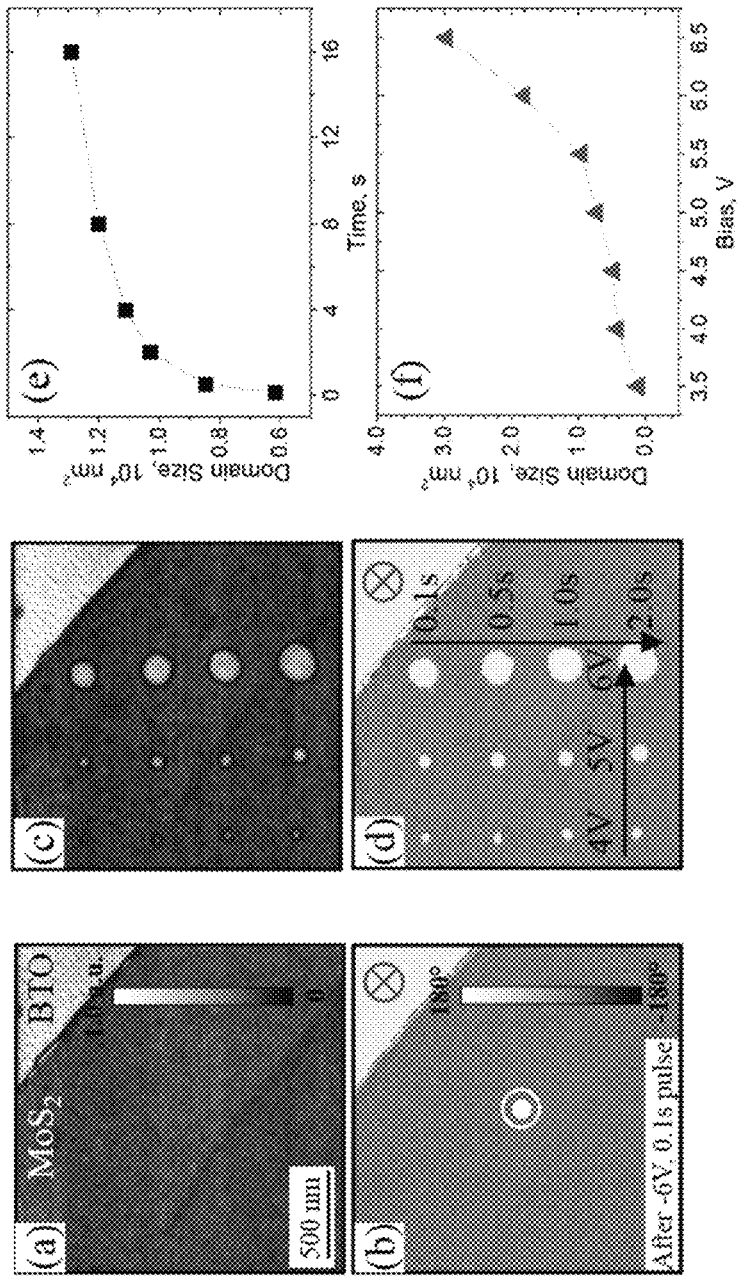
FIG. 3A is a topographical view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 3B is a topographical view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 3C is a topographical view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 3D is a topographical view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 3E is a graphical view illustrating switching behavior of a MoS$_2$/barium titanate junction used in a FET structure and how domain size is dependent on the electric pulse duration, such as the ferroelectric random-access memory structure shown in FIGS. 1A through 1C, in accordance with an example implementation of the present disclosure.
FIG. 3F is a graphical view illustrating switching behavior of a MoS$_2$/barium titanate junction used in a FET structure and how domain size is dependent on the electric pulse magnitude, such as the ferroelectric random-access memory structure shown in FIGS. 1A through 1C, in accordance with an example implementation of the present disclosure.
Figures 4A, 4B, 4C:
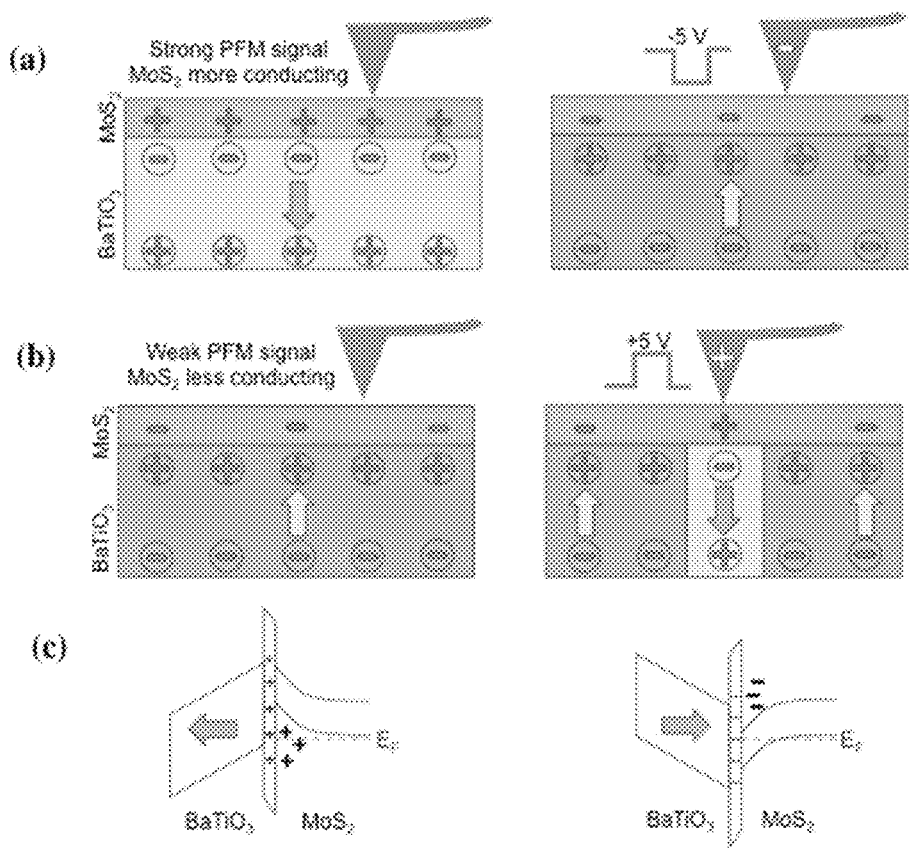
FIG. 4A is a schematic view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 4B is a schematic view illustrating switching behavior of a MoS$_2$/barium titanate junction used in a FET structure, such as the ferroelectric random-access memory structure shown in FIGS. 1A through 1C, in accordance with an example implementation of the present disclosure.
FIG. 4C is a schematic view illustrating the changes in the band structure of MoS$_2$/BTO associated with polarization-induced charge redistribution in a FET structure, such as the ferroelectric random-access memory structure shown in FIGS. 1A through 1C, in accordance with an example implementation of the present disclosure.

This interplay is also manifested in asymmetry of the switching from the downward to the upward direction and back. The application of a single negative voltage pulse (with an amplitude typically above 5 V and duration of 100 ms) leads to a complete switching of polarization from the downward to the upward direction in the whole volume of BTO underneath the $MoS_2$ flake (shown in FIGS. 3A and 3B). In contrast, application of a symmetric positive pulse resulted only in local switching of the upward polarization to the downward state right underneath the tip. This behavior is illustrated by FIGS. 3C and 3D showing an array of circular domains with downward polarization written by positive voltage pulses of various duration and amplitude. The tip-generated field drops as a non-linear function of distance from the tip-sample contact in the plane of the 2D $MoS_2$ sheet, which results in a strong domain size dependence on the pulse magnitude, but only in a weak dependence on the pulse duration (see FIGS. 3E and 3F). An abrupt increase occurs in the switched domain size when the applied positive voltage exceeds 5 V. All these circular domains may be erased (switched) by a single negative pulse applied to any point on the MoS$_2$ surface. This switching behavior is schematically illustrated in FIGS. 4A and 4B. MoS$_2$ behaves as an effective conductor when BTO polarization is oriented downward and exhibits more insulating behavior when polarization is upward. This asymmetry in switching along with the asymmetric PFM responses of oppositely poled junctions is indicative of a strong effect of BTO polarization on the conductivity of MoS$_2$/BTO interface.

In a ferroelectric capacitor, a spontaneous polarization Ps creates a depolarization field $E_d=P_s/\varepsilon_0\varepsilon_f$ and a respective potential drop across the ferroelectric $V=E_d d_f$. In the case of a capacitor with short-circuited metal electrodes, the bound polarization charge is compensated by accumulation of the screening charges on the electrodes. The screening charge density can be roughly estimated as $$\delta \cong \frac{P_s}{q\lambda_{TF}} \quad (1)$$

with an elementary charge q and the Thomas-Fermi screening length $$\lambda_{TF} = \sqrt{\frac{2\varepsilon_0 E_F}{3q^2 n_\infty}} \quad (2)$$

where $E_F$ and $n_\infty$ are the Fermi energy (counted from the bottom of the conduction band) and the density of electrons far away from the surface, respectively. For example, for SrRuTiO$_3$, $\lambda_{TF}\cong 0.85$ Å and $\delta \cong 1.8\times10^{22}$ cm$^{-3}$<<$n_\infty \cong 18\times10^{22}$ cm$^{-3}$, where P$_s$=25 μC/cm$^2$ as in BTO. The situation is different if one of the metal electrodes is replaced by a semiconductor, such as MoS$_2$. MoS$_2$ is an n-type semiconductor with the electron charge density of $n_{2D}\cong 10^{13}$ cm$^{-2}$. This electron charge density is much smaller than the surface charge density due to the BTO polarization (P$_s$/q=1.5×10$^{14}$ cm$^{-2}$), which means that the polarization screening by the majority carriers in MoS$_2$ is incomplete and has to be assisted by the external charges. If polarization in BTO is switched upward (toward MoS$_2$) by application of a negative bias, then the positive bound polarization charge would attract additional negative charge from the tip, which would lead to further filling of the conduction band in MoS$_2$ with electrons, thereby completely screening the polarization and ensuring its stability. This also enhances the conductivity of n-type MoS$_2$. In contrast, for the downward polarization, a negative bound charge expels electrons from MoS$_2$ making it less conductive and making polarization less stable. However, in terms polarization direction effect on MoS$_2$ conductivity, a completely opposite behavior occurs: a strong PFM signal from the MoS$_2$/BTO with the downward polarization provides a stronger metallic behavior of MoS$_2$ than in the case of MoS$_2$/BTO polarized upward, which exhibits a weak PFM signal (see FIGS. 2C and 2E). Thus, MoS$_2$ behaves as a p-type semiconductor. Additionally, field effect measurements in the MoS$_2$/PZT structures also show that MoS$_2$ also exhibited transport properties compatible with p-type conductivity. In addition, both polarization states in the MoS$_2$/BTO/SRO junctions exhibit equally strong retention.

In implementations, an adsorbate water layer 118 may be disposed at the MoS$_2$/BTO interface since the MoS$_2$ flakes have been transferred on the BTO surfaces in ambient conditions. Given this, the polarization-dependent switching mechanism can be facilitated by transfer of protons, in and out of MoS$_2$, made available by dissociative water adsorption. With polarization pointing downward, accumulation of the positive charge carriers at the MoS$_2$/BTO interface results in enhanced MoS$_2$ conductivity so that the MoS$_2$ flake behaves as a relatively good conductor. This allows complete switching from the downward to the upward polarization in the whole volume of BTO by application of a single negative pulse (see FIGS. 3A and 3B). When this happens, the positive polarization charges push protons away making MoS$_2$ behave more as an insulator (i.e., the overall conductivity of MoS$_2$ is reduced). Hence, under a positive pulse, the upward polarization can only be switched locally at the tip-sample contact where MoS$_2$ experiences a local insulator-to-metal transition. FIG. 4C illustrates the changes in the band structure of MoS$_2$/BTO associated with polarization-induced charge redistribution. The FET structure 100 and ferroelectric layer(s) have a stable nature of both upward and downward polarization states, particularly, in the case of the upward polarization, which requires negative charges for screening. Here, along with the screening by the negatively charged hydroxyl groups, application of the negative bias to MoS$_2$ pushes the Fermi level down to allow a sufficient amount of the electrons injected from the tip to be accumulated and trapped at the interface, stabilizing the polarization. This may be possible because the band gap of 1.2 eV in MoS$_2$ is much less than the maximum possible potential shift due to the applied bias of several Volts.

Figures 5A, 5B, 5C, 5D, 5E, 5F:
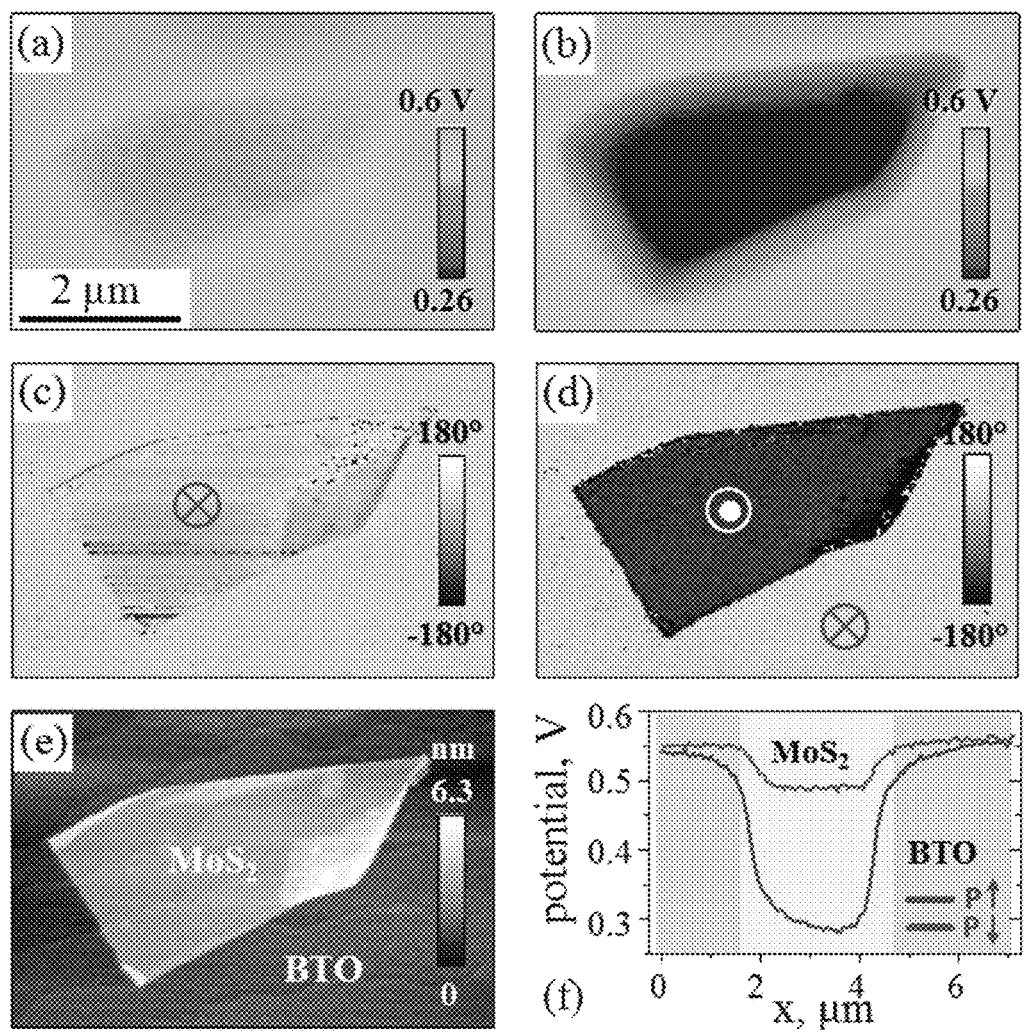
FIG. 5A is a surface potential map of a MoS$_2$-gated BTO junction as a function of polarization direction used in a FET structure, such as the ferroelectric random-access memory structure shown in FIGS. 1A through 1C, in accordance with an example implementation of the present disclosure.
FIG. 5B is a surface potential map of a MoS$_2$-gated BTO junction as a function of polarization direction used in a FET structure, such as the ferroelectric random-access memory structure shown in FIGS. 1A through 1C, in accordance with an example implementation of the present disclosure.
FIG. 5C is a PFM phase map corresponding with the surface potential maps of a MoS$_2$-gated BTO junction in FIGS. 5A and 5B used in a FET structure, such as the ferroelectric random-access memory structure shown in FIGS. 1A through 1C, in accordance with an example implementation of the present disclosure.
FIG. 5D is a PFM phase map corresponding with the surface potential maps of a MoS$_2$-gated BTO junction in FIGS. 5A and 5B used in a FET structure, such as the ferroelectric random-access memory structure shown in FIGS. 1A through 1C, in accordance with an example implementation of the present disclosure.
FIG. 5E is a topographical map corresponding with the surface potential maps of a MoS$_2$-gated BTO junction in FIGS. 5A and 5B used in a FET structure, such as the ferroelectric random-access memory structure shown in FIGS. 1A through 1C, in accordance with an example implementation of the present disclosure.
FIG. 5F is a graphical representation of the change of potential of a MoS$_2$ flake upon change in polarization of a BTO used in a FET structure, such as the ferroelectric random-access memory structure shown in FIGS. 1A through 1C, in accordance with an example implementation of the present disclosure.

To further show polarization-induced changes in the band structure of MoS$_2$/BTO, Kelvin Probe Force Microcopy (KPFM) measurements results are shown in FIGS. 5A and 5B. FIGS. 5A and 5B illustrate the surface potential maps of the MoS$_2$-gated BTO junction as a function of polarization direction with corresponding PFM phase maps shown in FIGS. 5C and 5D. A topographic image of this particular junction is shown in FIG. 5E. The surface potential maps for the MoS$_2$/BTO in FIGS. 5A and 5B distinctly show a decrease in the contact potential difference (CPD) for the upward polarization (in agreement with accumulation of negative charges at the MoS$_2$/BTO interface) in comparison with the CPD for the downward polarization. A cross-section analysis in FIG. 5F illustrates that the CPD of the MoS$_2$ flake changes by more than 0.2 V upon reversal of the polarization in BTO. More importantly, the CPD even for the upward polarization state is positive (about 0.25 V) showing the dominant role of positive charges in the MoS$_2$/BTO/SRO junctions.

Figures 6A, 6B:
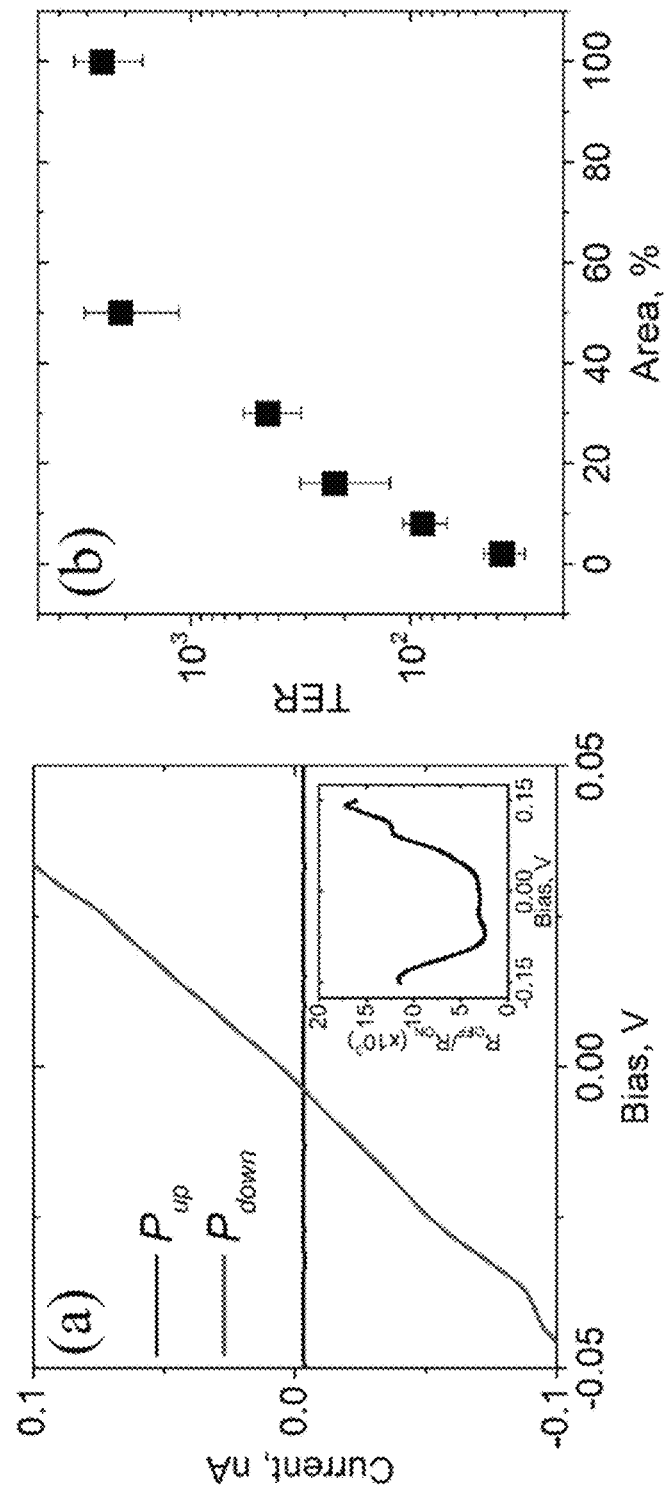
FIG. 6A is a graphical representation of I-V curves for opposite polarization states used in a FET structure, such as the ferroelectric random-access memory structure shown in FIGS. 1A through 1C, in accordance with an example implementation of the present disclosure.
FIG. 6B is a graphical representation showing a gradual change in TER value upon an increase in the area with downward polarization due to application of the positive pulses with increased duration in a FET structure, such as the ferroelectric random-access memory structure shown in FIGS. 1A through 1C, in accordance with an example implementation of the present disclosure.

The switchable and stable nature of polarization in MoS$_2$/BTO/SRO junctions enables their electronic transport characteristics. The band diagram in FIG. 4C illustrates that the ON state corresponds to the downward polarization. The I-V characteristics illustrated in FIGS. 6A and 6B show that the tunneling resistance measured in the junction after application of a positive bias (R$_{ON}$) is much lower than that of the junction poled by a negative pulse of −6 V (R$_{OFF}$). The TER value, which has been calculated as TER=(R$_{OFF}$−R$_{ON}$)/R$_{ON}$, reaches a level of 2500 when the whole area of the BaTiO$_3$ films underneath the MoS$_2$ flake is uniformly poled (see FIG. 5A). For comparison, in the BTO-based FTJs employing Co as a top electrode and with the same thickness of the barrier (6 u.c.), the maximum value of TER is of the order of 200. Furthermore, a strong time-voltage dependence of the switched area when switching occurs from the OFF to the ON state (i.e. from the upward to the downward polarization, see FIG. 3) allows tuning of the ON/OFF ratio by several orders of magnitude by varying the write pulse amplitude and duration, thereby adding memristive functionality to the $MoS_2$-gated BTO junctions. FIG. 6B illustrates a gradual change in the TER value upon increase in the area with downward polarization due to application of the positive pulses with increased duration.

Example Processes

Figure 7A:
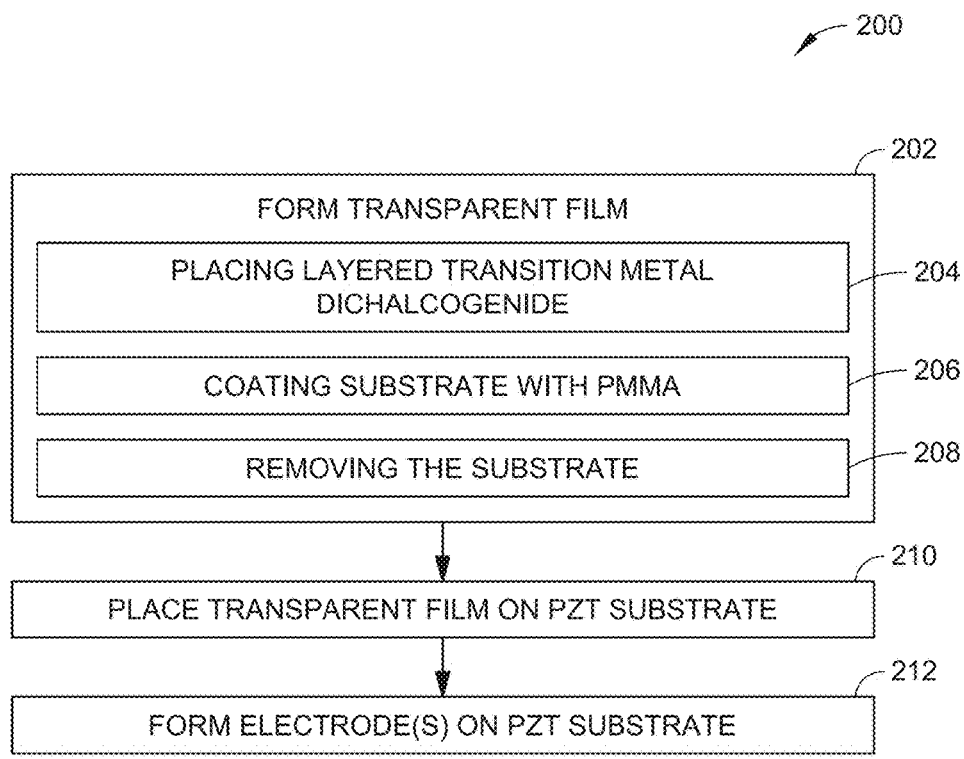
FIG. 7A is a flow diagram illustrating an example process for fabricating a ferroelectric random-access memory structure that includes using a molybdenum sulfide layer, such as the ferroelectric random-access memory structure illustrated in FIGS. 1A and 1B.
Figure 7B:
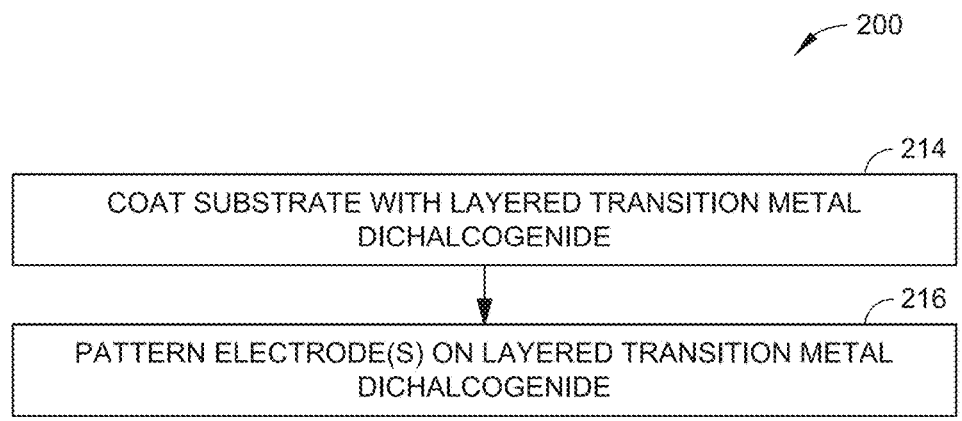
FIG. 7B is a flow diagram illustrating an example process for fabricating a ferroelectric random-access memory structure that includes using a molybdenum sulfide layer, such as the ferroelectric random-access memory structure illustrated in FIGS. 1A and 1B.
Figures 8A, 8B, 8C, 8D, 8E, 8F, 8G:
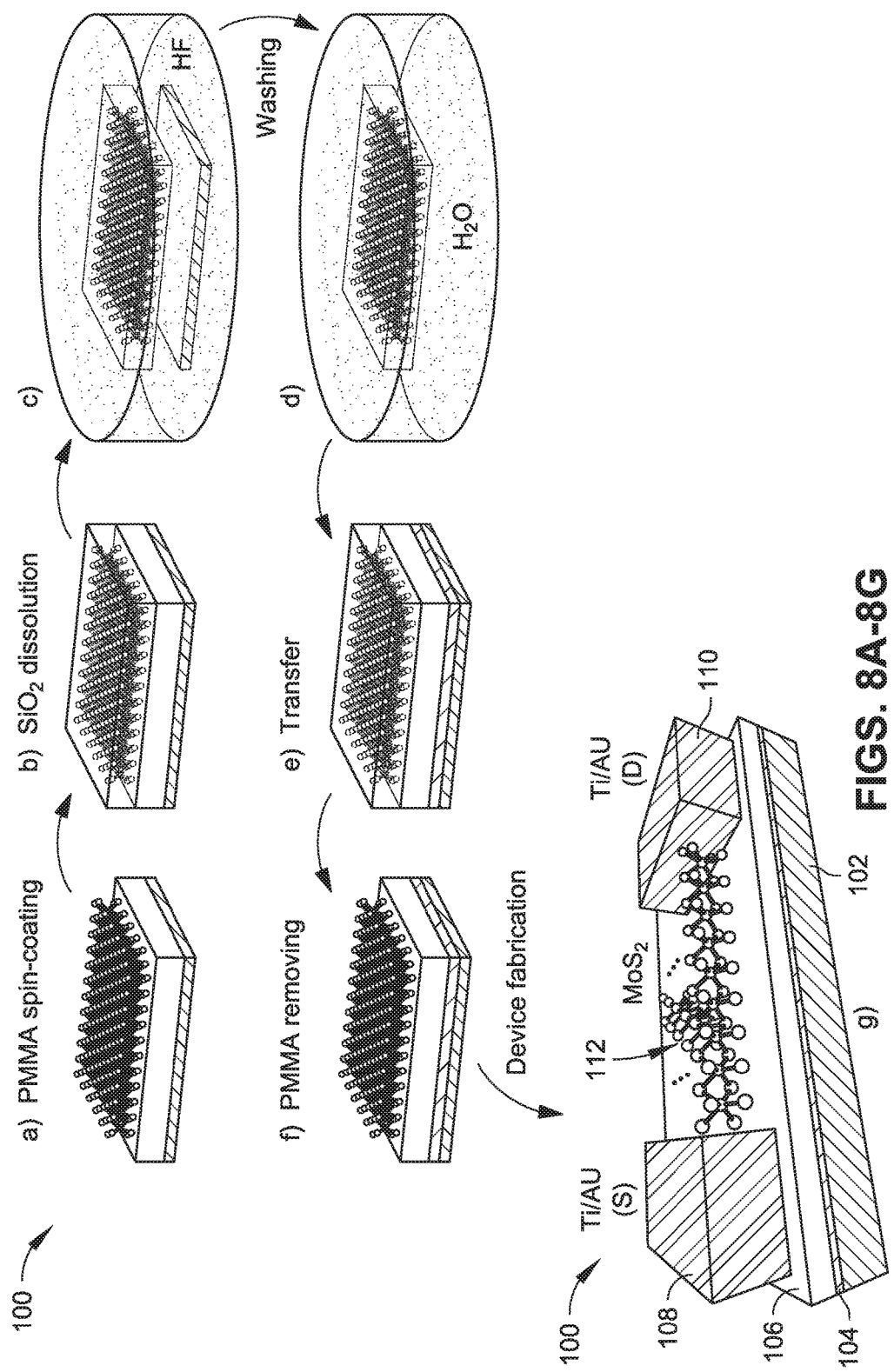
FIG. 8A is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8B is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8C is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8D is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8E is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8F is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.
FIG. 8G is a process view illustrating an example process for fabricating a ferroelectric random-access memory structure that includes using a molybdenum sulfide layer illustrated in FIGS. 1A through 1C, in accordance with the processes shown in FIGS. 6A and/or 6B.

The following discussion describes example techniques for fabricating a ferroelectric random-access memory structure (FeRAM) and/or a ferroelectric random-access memory FTJ structure, such as the ferroelectric random-access memory structure 100 shown in FIGS. 1A and 1B. FIGS. 7A and 7B depict an example process 200 for fabricating the ferroelectric random-access memory structure 100.

As shown in FIGS. 7A and 8A through 8G, a transparent film is formed (Block 202). Forming the transparent film can include placing a layered transition metal dichalcogenide on a substrate (Block 204), coating the substrate with polymethyl methacrylate (PMMA) (Block 206), and removing the substrate (Block 208). In a specific embodiment, MoS2 single crystal and p-type silicon wafers (e.g., substrate 102) covered with 300±15 nm thick $SiO_2$ can be used to prepare MoS2 flakes (e.g., layered transition metal dichalcogenide 112). MoS2 flakes can be exfoliated on the surface of a $Si/SiO_2$ substrate using an adhesive tape. The $Si/SiO_2$ substrate with MoS2 flakes can then covered with a PMMA solution by spin-coating and then air drying. The substrate can then be placed on the surface of 5% HF aqueous solution for approximately 1 min to etch away and remove the $SiO_2$ layer. The resulting transparent MoS2/PMMA film can be washed by transferring to the surface of deionized (DI) water for about 5 minutes. Washing of the MoS2/PMMA film with DI water may be repeated (e.g., 3-4 times). Then, the transparent film is placed on a lead zirconium titanate (PZT) substrate (Block 210). The transparent MoS2/PMMA film can be transferred to a PZT substrate (e.g., gate dielectric substrate 106). After drying in air at room temperature the PZT substrate can be washed (e.g., by hot (50° C.) acetone) to remove the PMMA layer, rinsed with isopropanol and water, and dried with nitrogen gas.

At least one electrode is formed on the lead zirconium titanate (PZT) substrate (Block 212). In implementations, the source electrode 108 and the drain electrode 110 can be formed using electron-beam lithography, which can include scanning a focused beam of electrons to indicate the shapes of the electrodes on a surface covered with an electron-sensitive film including a resist. The electron beam changes the solubility of the resist, enabling selective removal of either the exposed or non-exposed regions of the resist by immersing it in a solvent or etchant. In implementations, electron-beam lithography can be used to form Ti/Au source electrode(s) 108 and/or Ti/Au drain electrode(s) 110.

As shown in FIGS. 7B and 8A through 8G, an additional process 200 for fabricating a ferroelectric random-access memory structure 100 is shown. First, a substrate is coated with a layered transition metal dichalcogenide (Block 214). In the specific embodiment shown in FIG. 3, PMMA can be spin-coated on a $Si/SiO_2$ or PZT substrate (e.g., substrate 102) with MoS2 flakes (e.g., at 5000 rpm for 45 seconds). Then the substrate can be heated (e.g., placed on a hotplate at 180° C. for 120 s). A scanning electron microscope and a pattern generator can be used for electron beam lithography to pattern electrodes on a MoS2 flake (see below). After exposure, the substrate can be developed (e.g., in a methyl isobutyl ketone:isopropanol (1:3) (MIBK:IPA mixture) for 60 seconds), then successively rinsed (e.g., with 2-propanol and DI water) and dried with nitrogen gas. An electron beam evaporation system (e.g., base pressure of ~8×10$^{-9}$ Torr) may be used to evaporate 1 nm of Cr at 0.1 Å/s rate, which monitored a quartz crystal microbalance. This can be immediately followed by evaporation of 15 nm of Au at 0.2 Å/s rate. PMMA and excessive metals may be removed (e.g., by lift-off in acetone for 30 min). Finally, the substrate may be rinsed (e.g., with isopropanol and water) and dried with nitrogen gas Electrodes are patterned on the layered transition metal dichalcogenide using electron beam lithography (Block 216). In implementations, the source electrode 108 and the drain electrode 110 can be formed using electron-beam lithography, which can include scanning a focused beam of electrons to indicate the shapes of the electrodes on a surface covered with an electron-sensitive film including a resist. The electron beam changes the solubility of the resist, enabling selective removal of either the exposed or non-exposed regions of the resist by immersing it in a solvent or etchant. In implementations, electron-beam lithography can be used to form Ti/Au source electrode(s) 108 and/or Ti/Au drain electrode(s) 110.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A ferroelectric random-access memory structure, comprising:
    at least one FeFET including
        a substrate;
        a back gate electrode formed on the substrate, the back gate electrode including a conductive layer;
        a gate dielectric substrate formed on the back gate electrode;
        a source electrode formed on the gate dielectric substrate;
        a drain electrode formed on the gate dielectric substrate; and
        a bridge disposed on the gate dielectric substrate and contacting the source electrode and the drain electrode, wherein the bridge consists essentially of a layered transition metal dichalcogenide.

2. The ferroelectric random-access memory structure of claim 1, wherein the substrate includes a $Si/SiO_2$ substrate.

3. The ferroelectric random-access memory structure of claim 1, wherein the conductive layer includes a $TiO_2/Ir$ layer.

4. The ferroelectric random-access memory structure of claim 1, wherein the gate dielectric substrate includes a lead zirconium titanate (PZT) substrate.

5. The ferroelectric random-access memory structure of claim 1, wherein the gate dielectric substrate includes a barium titanate substrate.

6. The ferroelectric random-access memory structure of claim 1, wherein the source electrode includes a titanium gold (Ti/Au) source electrode.

7. The ferroelectric random-access memory structure of claim 1, wherein the drain electrode includes a titanium gold (Ti/Au) drain electrode.

8. The ferroelectric random-access memory structure of claim 1, wherein the layered transition metal dichalcogenide includes at least one of molybdenum disulfide (MoS2) or tungsten disulfide ($WS_2$) and wherein the layered transition metal dichalcogenide is a monolayer or multilayer.

9. A ferroelectric random-access memory structure, comprising:
at least one ferroelectric tunnel junction including
a substrate;
a bottom electrode formed on the substrate;
a ferroelectric barrier having a thickness less than 5 nanometers formed on the bottom electrode; and
a layered transition metal dichalcogenide disposed on the ferroelectric barrier.

10. The ferroelectric random-access memory structure of claim 9, wherein the substrate includes a $Si/SiO_2$ substrate.

11. The ferroelectric random-access memory structure of claim 9, wherein the ferroelectric barrier includes a lead zirconium titanate (PZT) substrate.

12. The ferroelectric random-access memory structure of claim 9, wherein the ferroelectric barrier includes a barium titanate substrate.

13. The ferroelectric random-access memory structure of claim 9, further comprising:
an adsorbate water layer disposed at a layered transition metal dichalcogenide and ferroelectric barrier interface.

* * * * *

UNITED STATES PATENT AND TRADEMARK OFFICE
CERTIFICATE OF CORRECTION

| | |
|---|---|
| PATENT NO. | : 10,163,932 B1 |
| APPLICATION NO. | : 15/218795 |
| DATED | : December 25, 2018 |
| INVENTOR(S) | : Alexander Sinitskii et al. |

It is certified that error appears in the above-identified patent and that said Letters Patent is hereby corrected as shown below:

On the Title Page

Item (72) Delete "Grouverman" and insert --Gruverman-- therefor.

Signed and Sealed this
First Day of October, 2019

Andrei Iancu
*Director of the United States Patent and Trademark Office*